US010991853B2

(12) United States Patent
Walter et al.

(10) Patent No.: US 10,991,853 B2
(45) Date of Patent: Apr. 27, 2021

(54) CARRIER FOR AN OPTOELECTRONIC COMPONENT, METHOD OF PRODUCING A CARRIER FOR AN OPTOELECTRONIC COMPONENT, WAFER AND SOLDERING METHOD

(71) Applicant: OSRAM Opto Semiconductors GmbH, Regensburg (DE)

(72) Inventors: Christoph Walter, Regensburg (DE); Roland Enzmann, Regensburg (DE); Markus Horn, Straubing (DE); Jan Seidenfaden, Neumarkt i.d. Oberpfalz (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 16/061,358

(22) PCT Filed: Dec. 14, 2016

(86) PCT No.: PCT/EP2016/081036
§ 371 (c)(1),
(2) Date: Jun. 12, 2018

(87) PCT Pub. No.: WO2017/102863
PCT Pub. Date: Jun. 22, 2017

(65) Prior Publication Data

US 2018/0366616 A1 Dec. 20, 2018

(30) Foreign Application Priority Data

Dec. 14, 2015 (DE) ..................... 10 2015 121 711.2
Apr. 12, 2016 (DE) ..................... 10 2016 106 734.2

(51) Int. Cl.
*H01L 23/34* (2006.01)
*H01L 23/00* (2006.01)
(Continued)

(52) U.S. Cl.
CPC .............. *H01L 33/44* (2013.01); *H01L 24/00* (2013.01); *H01L 33/62* (2013.01);
(Continued)

(58) Field of Classification Search
CPC ...................................................... H01L 33/62
See application file for complete search history.

(56) References Cited

U.S. PATENT DOCUMENTS 4,769,525 A 9/1988 Leatham
5,700,987 A * 12/1997 Basavanhally ...... G02B 6/4225 219/209

(Continued)

FOREIGN PATENT DOCUMENTS

EP 1 193 750 A2 4/2002

*Primary Examiner* — Allen L Parker
*Assistant Examiner* — Gustavo G Ramallo
(74) *Attorney, Agent, or Firm* — DLA Piper LLP (US)

(57) ABSTRACT

A carrier for an optoelectronic component includes a main body, wherein the main body includes a first electrically conductive heating layer arrangement, a first solder layer for soldering an optoelectronic component to the main body is arranged on a first side of the main body, the first electrically conductive heating layer arrangement is electrically insulated from the first solder layer and thermally connected to the first solder layer, and the first heating layer arrangement has an exposed portion on which molten solder of the first solder layer can flow to reduce an electrical resistance of the first heating layer arrangement.

20 Claims, 8 Drawing Sheets

401
121 125 123 127 105 115
501 119 501
107 113
103

(51) Int. Cl.
*H01L 33/44* (2010.01)
*H01L 33/62* (2010.01)

(52) U.S. Cl.
CPC ............... *H01L 2224/83234* (2013.01); *H01L 2933/0033* (2013.01); *H01L 2933/0066* (2013.01)

(56) References Cited

U.S. PATENT DOCUMENTS 5,960,014 A * 9/1999 Li ......................... H01S 5/0261 372/20
6,423,939 B1 * 7/2002 Pan ...................... H05K 1/0212 219/209
8,462,462 B1 6/2013 Moravec et al.
2004/0113231 A1 * 6/2004 Hoag .................. H01L 23/3171 257/528
2006/0109632 A1 * 5/2006 Berlin ................. H01L 23/3677 361/719
2007/0153526 A1 * 7/2007 Lim .................... F21V 19/0055 362/294
2010/0309643 A1 * 12/2010 Todt ..................... G02B 6/4201 361/808
2011/0024772 A1 * 2/2011 Diamantidis ............ F21K 9/00 257/88
2011/0265709 A1 * 11/2011 Satoh ...................... C30B 23/00 117/84
2012/0211793 A1 * 8/2012 Bergmann ............ H01L 27/153 257/99
2013/0011104 A1 1/2013 Sato et al.
2013/0344612 A1 * 12/2013 Zuo .................... G01N 25/4806 436/147
2015/0373886 A1 12/2015 Sloane
2018/0374991 A1 * 12/2018 Bour ....................... H01L 33/14
2019/0198795 A1 * 6/2019 Renn ....................... H01L 33/62

* cited by examiner 701
733
727
119
113
103
711
709
715
115 105
725
705
713
107
127
123
109
707
125
731
121
111
721
117
703
717
719
723
729

801
727
119
113
103
713
717
721
115 105
107
127
123
125
109
705
803
121
111
117
805
703
715
719
723
729

901
101
101
101
101
101
101
101
125
127
115
121
109
111
117
125
127
107
203
201
121
115
903
109
111
117

CARRIER FOR AN OPTOELECTRONIC COMPONENT, METHOD OF PRODUCING A CARRIER FOR AN OPTOELECTRONIC COMPONENT, WAFER AND SOLDERING METHOD

TECHNICAL FIELD

This disclosure relates to a carrier for an optoelectronic component, a method of producing a carrier for an optoelectronic component, a wafer, and a soldering method

BACKGROUND

Optoelectronic components are usually soldered onto a carrier. Usually, the component and/or the carrier has a solder layer that has to be heated for soldering purposes. The thermal energy required is provided by a gripping tool or heating plate, for example.

There is thus a need to provide an efficient concept that facilitates efficient soldering of an optoelectronic component onto a main body of a carrier.

SUMMARY

We provide a carrier for an optoelectronic component including a main body, wherein the main body includes a first electrically conductive heating layer arrangement, a first solder layer for soldering an optoelectronic component to the main body is arranged on a first side of the main body, the first electrically conductive heating layer arrangement is electrically insulated from the first solder layer and thermally connected to the first solder layer, and the first heating layer arrangement has an exposed portion on which molten solder of the first solder layer can flow to reduce an electrical resistance of the first heating layer arrangement.

We also provide a method of producing a carrier for an optoelectronic component including providing a main body, wherein the main body includes a first electrically conductive heating layer arrangement, and forming an electrical insulation, a thermal connection and a first solder layer for soldering an optoelectronic component to the main body on a first side of the main body such that the first electrically conductive heating layer arrangement is electrically insulated from the first solder layer and thermally connected to the first solder layer.

We further provide a wafer including a plurality of carriers for an optoelectronic component including a main body, wherein the main body includes a first electrically conductive heating layer arrangement, a first solder layer for soldering an optoelectronic component to the main body is arranged on a first side of the main body, the first electrically conductive heating layer arrangement is electrically insulated from the first solder layer and thermally connected to the first solder layer, and the first heating layer arrangement has an exposed portion on which molten solder of the first solder layer can flow to reduce an electrical resistance of the first heating layer arrangement.

We further yet provide a soldering method using a carrier for an optoelectronic component including a main body, wherein the main body includes a first electrically conductive heating layer arrangement, a first solder layer for soldering an optoelectronic component to the main body is arranged on a first side of the main body, the first electrically conductive heating layer arrangement is electrically insulated from the first solder layer and thermally connected to the first solder layer, and the first heating layer arrangement has an exposed portion on which molten solder of the first solder layer can flow to reduce an electrical resistance of the first heating layer arrangement, wherein an optoelectronic component is soldered to the main body by the first solder layer by virtue of the first electrically conductive heating layer arrangement having a voltage or an electric current applied thereto such that the first electrically conductive heating layer arrangement is heated to melt the first solder layer.

LIST OF REFERENCE SIGNS

Figure 1:
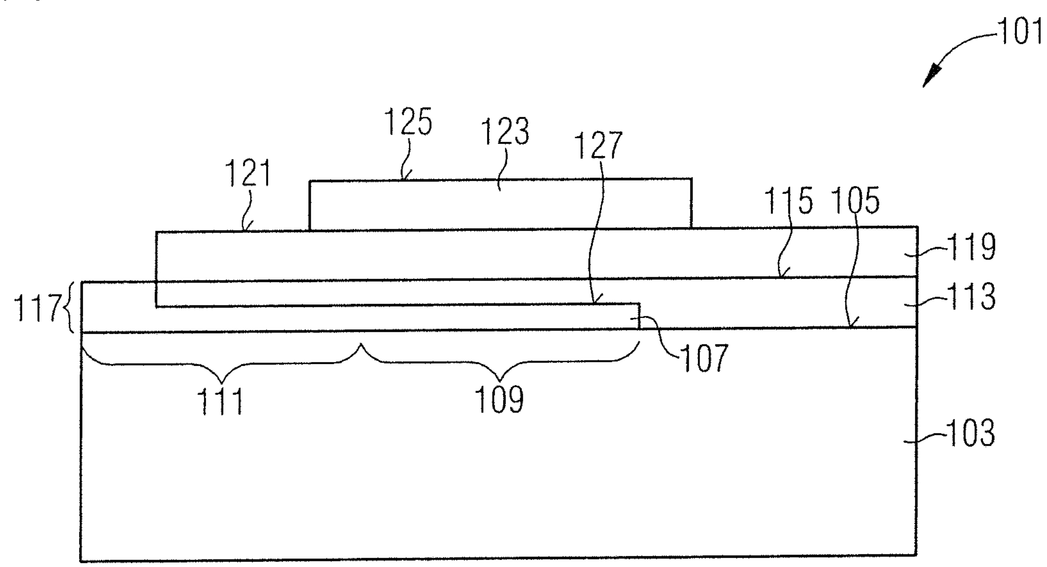
FIG. 1 shows a first carrier for an optoelectronic component.

101 Carrier
103 Main body
105 First side of the main body
107 First heating layer arrangement
109 Heating portion of the first heating layer arrangement
111 First contacting portion of the first heating layer arrangement
113 First passivation layer
115 Upper side of the first passivation layer
117 Electric line
119 Further layer arrangement
121 Upper side of the further layer arrangement
123 First solder layer
125 Upper side of the first solder layer
127 Upper side of the first heating layer arrangement
201 Electric line
203 Second electrical contacting portion of the first heating layer arrangement
205 Portion of the two-dimensional coil structure
207 Connecting portion of the two-dimensional coil structure
401 Carrier
501 Exposed portion of the first heating layer arrangement
701 Carrier
703 Second side of the main body
705 Second heating layer arrangement
707 Heating portion of the second heating layer arrangement
709 First contacting portion of the second heating layer arrangement
711 Electric line
713 Second passivation layer

715 Upper side of the second passivation layer
717 Further layer arrangement
719 Upper side of the further layer arrangement
721 Second solder layer
723 Upper side of the second solder layer
725 Portion of the second passivation layer
727 Carrier component
729 Assembly area
731 Electrical contacting area
733 Electrical contacting area
801 Carrier
803 Electrical contacting area
805 Electrical via
901 Wafer
903 Optoelectronic component
1001 Edge
1101 Provision
1103 Formation
1201 Application
1203 Soldering

DETAILED DESCRIPTION

Our carrier for an optoelectronic component may comprise:

a main body, wherein the main body comprises a first electrically conductive heating layer arrangement, a first solder layer for soldering an optoelectronic component to the main body is arranged on a first side of the main body, and the first electrically conductive heating layer arrangement is electrically insulated from the first solder layer and thermally connected to the first solder layer.

Our method may produce a carrier for an optoelectronic component by the following steps:

providing a main body, wherein the main body comprises a first electrically conductive heating layer arrangement, forming an electrical insulation, a thermal connection and a first solder layer for soldering an optoelectronic component to the main body on a first side of the main body such that the first electrically conductive heating layer arrangement is electrically insulated from the first solder layer and thermally connected to the first solder layer.

Our wafer may comprise a plurality of carriers.

Our soldering method uses the carrier and/or the wafer, wherein an optoelectronic component is soldered to the main body by the first solder layer by virtue of the first electrically conductive heating layer arrangement having a voltage or an electric current applied thereto such that the first electrically conductive heating layer arrangement heats up to melt the first solder layer.

Each carrier is provided with its own electrically conductive heating layer arrangement. The electrically conductive heating layer arrangement acts as an electrical resistance heater and provides the thermal energy required for soldering. Consequently, what is advantageously brought about on account of the thermal connection between the first solder layer and the first heating layer arrangement is that the thermal energy produced by the first heating layer arrangement can be guided efficiently to the first solder layer. Thus, as a result, the first solder layer advantageously heats up and ultimately melts at an appropriate temperature such that soldering of the optoelectronic component to the main body can be brought about in an efficient manner.

Thus, as a result of the main body comprising a dedicated electrically conductive heating layer arrangement, the thermal energy required for the soldering no longer needs to be provided by way of the gripper tool or a heating plate. Consequently, it is possible to dispense with such a gripper tool or such a heating plate, for example. As a result, it is possible to save costs, for example. In particular, this allows the material outlay to be reduced.

In particular, this allows the thermal energy to be able to be provided to the first solder layer with a higher spatial accuracy to the extent that the thermal energy is produced by the heating layer arrangement comprised of the main body, i.e., situated at a smaller distance from the first solder layer than a heating plate on which the main body is normally placed for soldering purposes.

As a result, increased process reliability can advantageously be brought about on account of thermal energy being introduced directly at, or closer to, the solder interface.

Since consequently, as a rule, the thermal path to the first solder layer is shorter than in known methods for the thermal energy produced, the soldering process will be shorter, as a rule. As a result, it is advantageously possible to avoid temperature-driven damage at the individual elements, for example, in particular at the optoelectronic component.

In particular, an efficient temperature measurement is advantageously facilitated by the electrically conductive heating layer arrangement. This is brought about, in particular, by an electrical characteristic, for example, being predetermined, the characteristic having been measured once in advance, for example. By way of example, such a characteristic specifies the relationship or the dependence of a voltage applied to the heating layer arrangement with/on the temperature of the heating layer arrangement. In particular, the characteristic specifies a relationship or dependence of an electric current that flows through the first heating layer arrangement with/on a temperature of the heating layer arrangement.

That is to say, different voltages are applied to the heating layer arrangement, with the electric current, for example, and/or the temperature of the heating layer arrangement, for example, being measured for each of the applied voltages. Accordingly, it is possible to ascertain a characteristic.

Particularly if the plurality of carriers are comprised of a wafer, i.e., if they are situated in a wafer assemblage, the targeted heating of only a first solder layer of an individual carrier, for example, is advantageously facilitated without the adjacent carriers also being heated in the process.

The phrases "thermally connected" and "thermal connection" define a connection in particular having a thermal conductivity of at least 1 W/(m*K), for example, at least 2 W/(m*K), for example, at least 4 W/(m*K), for example, at least 8 W/(m*K), for example, at least 16 W/(m*K), for example, at least 100 W/(m*K), for example, at least 200 W/(m*K), for example, at least 300 W/(m*K).

By way of example, the main body has a thermal conductivity as listed above in conjunction with the phrases "thermally connected" and "thermal connection." This brings about the technical advantage of, in particular, a heat loss being able to be efficiently dissipated during operation of the optoelectronic component that is soldered onto the main body.

The phrase "electrically connected" means, in particular, "connected in an electrically conductive manner."

The optoelectronic component may be an element from the following group of optoelectronic components: a light-emitting diode (LED), in particular an organic or inorganic light-emitting diode, a laser diode, a diode chip, an LED chip, a laser diode chip, a laser bar.

The main body may be configured as a submount and it may be referred to as such.

The carrier may be formed from one or more of the following materials and/or comprises one or more of the following materials: AlN, SiC, Si.

The first electrically conductive heating layer arrangement may comprise one or more layers. That is to say, the heating layer arrangement is formed from a plurality of layers, for example. By way of example, the one layer and/or each one of the plurality of layers per se is electrically conductive.

By way of example, the first electrically conductive heating layer arrangement comprises a titanium layer. By way of example, the first electrically conductive heating layer arrangement comprises a platinum layer. By way of example, the first electrically conductive heating layer arrangement comprises a gold layer. By way of example, the first electrically conductive heating layer arrangement comprises a layer stack formed from a titanium layer, a platinum layer and a gold layer.

By way of example, the titanium layer, as first layer of the layer stack, may be arranged on the first side of the main body. By way of example, the platinum layer, as the second layer of the layer stack, may be applied to, or arranged on, the titanium layer. By way of example, the gold layer, as a third layer of the layer stack, may be arranged on the second layer, i.e., the platinum layer.

A thickness of the first electrically conductive heating layer arrangement is 15 nm to 200 nm, for example.

The titanium layer advantageously brings about an efficient adhesion of the subsequent platinum layer on the main body, i.e., on the first side of the main body. The platinum layer advantageously brings about the possibility of an efficient prevention of a diffusion of gold atoms from the gold layer into the main body.

The first side of the main body may be formed as an upper side of the main body. That means that the first side of the main body is the upper side of the main body, for example.

The carrier may comprise an optoelectronic component, wherein the optoelectronic component is soldered onto the main body or soldered with the main body by the first solder layer.

The first heating layer arrangement may be electrically insulated from the first solder layer by a first electrically insulating passivation layer by virtue of the first passivation layer being arranged at least in part on the first heating layer arrangement, wherein the first solder layer is arranged at least indirectly on the first passivation layer.

In particular, this brings about the technical advantage of being able to produce an efficient electrical insulation. This is true, in particular, because the passivation layer can be efficiently produced by processes known per se and can be applied to the first side of the main body.

The first passivation layer may have a thickness of 10 nm to 200 nm.

The phrasing that the first solder layer is arranged at least indirectly on the first passivation layer means that, for example, the first solder layer is not arranged, directly but indirectly on the first passivation layer. That is to say that in the indirect arrangement, at least one further layer is still provided between the first solder layer and the passivation layer. By way of example, a layer stack formed from a titanium layer, a platinum layer and a gold layer is provided between the first solder layer and the first passivation layer. By way of example, a titanium layer may be directly applied to, or arranged on, the first passivation layer. By way of example, a platinum layer is arranged on, or applied to, the titanium layer. By way of example, a gold layer is arranged on, or applied to, the platinum layer. By way of example, the first solder layer is arranged on, or applied to, the gold layer. By way of example, the thickness of this layer stack is 500 nm to 600 nm.

The first solder layer may be an AuSn-layer. That is to say that the first solder layer is formed from AuSn, for example.

A thickness of the first solder layer is 0.5 μm to 3.5 μm, for example.

The technical effects and advantages for the layer stack situated between the first solder layer and the passivation layer should be seen to be analogous, in particular, to the technical advantages of the titanium/platinum/gold layer stack of the first electrically conductive heating layer arrangement. Thus, the titanium layer facilitates an efficient adhesion of the solder layer, for example. Consequently, the platinum layer, for example, prevents gold from the first solder layer from diffusing into the passivation layer. The gold layer advantageously likewise brings about an efficient adhesion of the first solder layer.

An electric line may extend from an upper side, facing away from the first side of the main body, of the first passivation layer to the first heating layer arrangement through the first passivation layer to be formed for the purposes of electrically contacting the first heating layer arrangement. That is to say that, an electric line is formed for the purposes of electrically contacting the first heating layer arrangement, wherein the electric line extends from an upper side, facing away from the first side of the main body, of the first passivation layer to the first heating layer arrangement through the first passivation layer. Thus, the electric line extends from an upper side of the first passivation layer to the first heating layer arrangement through the first passivation layer. The upper side of the first passivation layer faces away from the first side of the main body. Thus, the electric line electrically contacts the first heating layer arrangement; i.e., it is connected in an electrically conductive manner to the latter. By way of example, this electric line can be referred to as a first electric line.

In particular, this brings about the technical advantage of being able to bring about efficient electrical contacting of the first heating layer arrangement.

The electric line may be formed by the first heating layer arrangement.

In particular, this brings about the technical advantage of being able to produce the electric line efficiently. This is because, for example, the first heating layer arrangement may already be configured such that it comprises a portion which, after formation of the passivation layer, extends through the latter. That is to say that the first heating layer arrangement is and/or has been structured such that, for example, the electric line extends through the passivation layer, as described above, after an application of the passivation layer.

The first heating layer arrangement may have a first electrical contacting portion, a second electrical contacting portion and a heating portion extending between the first solder layer and the first side, wherein the heating portion of the first heating layer arrangement is electrically contacted by the two electrical contacting portions of the first heating layer arrangement.

In particular, this brings about the technical advantage of being able to efficiently heat the first solder layer. This is because efficient local heating of the solder layer can be brought about by the heating portion being situated between the solder layer and the first side of the main body.

The heating portion of the first heating layer arrangement may have a stripe form or a two-dimensional coil structure.

The stripe form advantageously allows the heating portion to be produced in an efficient and simple manner.

In particular, a two-dimensional coil structure for the heating portion brings about the technical advantage of being able to bring about efficient electric current guidance, provided lateral transverse resistances are smaller in comparison with a stripe form.

The phrasing "two-dimensional" in conjunction with the coil structure means that, in particular, the corresponding heating portion extends in a real fashion in a plane.

The first heating layer arrangement may have an exposed portion on which molten solder of the first solder layer can flow to reduce an electrical resistance of the first heating layer arrangement.

This brings about the technical advantage of, in particular, a self-regulating soldering process being facilitated. This is because the solder, when it melts, will run on the exposed portion and as a result thereof, i.e., as a result of the electrical contact arising in that case, it will reduce an electrical resistance of the first heating layer arrangement. A reduction in the electrical resistance of the first heating layer arrangement advantageously brings about a reduction in the electrical heat loss, and so the temperature drops or becomes lower as a result thereof. Consequently, this advantageously prevents the temperature of the solder rising above a temperature that is critical to the optoelectronic component.

Further, this brings about the technical effect of, for example, the melting temperature of the solder only being maintained until the solder has flowed onto the exposed portion. That is to say, the optoelectronic component is only exposed to the melting temperature during this time interval. As a result, this can avoid damage to the component due to heat, for example.

Thus, this means that, for example, too strong heating of the first solder layer can be efficiently avoided. Too strong means that, in particular, a temperature that lies more than 20% above the melting temperature of the solder layer is reached.

Thus, this can advantageously avoid heat damage to the individual elements of the carrier and, in particular, to the component.

A second electrically conductive heating layer arrangement may be arranged on a second side of the main body, lying opposite the first side, wherein the second heating arrangement is electrically insulated from a second solder layer arranged on the second side and thermally connected to the second solder layer.

This brings about the technical advantage of, in particular, the carrier itself being able to be soldered on or soldered with a second or further carrier, for example.

The main body may be soldered onto a further carrier by the second solder layer by virtue of the second electrically conductive heating layer arrangement having a voltage or an electric current applied thereto such that the second electrically conductive heating layer arrangement heats up to melt the second solder layer. The further carrier may also be referred to as a carrier component.

The second side of the main body may be formed as a lower side of the main body. That is to say that, for example, the second side of the main body is the lower side of the main body.

Technical features and technical properties of the second heating layer arrangement emerge in analogous fashion to the technical properties and technical features of the first heating layer arrangement, for example. That is to say that the explanations given in conjunction with the first heating layer arrangement apply analogously to the second heating layer arrangement, and vice versa. Therefore, reference is made to the explanations correspondingly given for the purposes of avoiding repetition.

The second heating layer arrangement may be electrically insulated from the second solder layer by a second electrically insulating passivation layer by virtue of the second passivation layer being arranged at least in part on the second heating layer arrangement, wherein the second solder layer is arranged at least indirectly on the second passivation layer.

The technical advantages that emerge from the example comprising the second passivation layer should be considered to be analogous to the technical advantages as emerge in conjunction with examples comprising the first passivation layer. Reference is made to the explanations correspondingly given for the purposes of avoiding repetition.

Technical features and technical properties of the second passivation layer emerge analogously from the technical features and technical properties of the first passivation layer. That is to say, the second passivation layer can have properties and technical features as described in conjunction with the first passivation layer.

An electric line extending from an upper side, facing away from the second side of the main body, of the second passivation layer to the second heating layer arrangement through the second passivation layer may be formed for the purpose of electrically contacting the second heating layer arrangement. That is to say that, an electric line may be formed for the purpose of electrically contacting the second heating layer arrangement, wherein the electric line extends from an upper side, facing away from the second side of the main body, of the second passivation layer to the second heating layer arrangement through the second passivation layer. Thus, the electric line extends from an upper side of the second passivation layer to the second heating layer arrangement through the second passivation layer. The upper side of the second passivation layer faces away from the second side of the main body. Thus, the electric line electrically contacts the second heating layer arrangement; i.e., it is connected in an electrically conductive manner to the latter. By way of example, this electric line can be referred to as a second electric line.

In particular, this brings about the technical advantage of being able to bring about efficient electrical contacting of the second heating layer arrangement.

The electric line may be formed by the second heating layer arrangement.

The technical advantages emerging therefrom should be considered to be analogous to the technical advantages as have emerged in conjunction with the example in which the electric line is formed by the first heating layer arrangement. Reference is made to the explanations correspondingly given for the purposes of avoiding repetitions.

The second heating layer arrangement may have a first electrical contacting portion, a second electrical contacting portion and a heating portion extending between the second solder layer and the second side, wherein the heating portion of the second heating layer arrangement is electrically contacted by the two electrical contacting portions of the second heating layer arrangement.

Here, too, the technical advantages should be considered to be analogous to the technical advantages specified above, as have emerged in conjunction with the first heating layer arrangement comprising the first and the second electrical contacting portion and the first and the second electrical contacting portion and the heating portion.

The heating portion of the second heating layer arrangement may have a stripe form or a two-dimensional coil structure.

The corresponding advantages emerge analogously to the advantages of the example according to which the heating portion of the first heating layer arrangement has a stripe form or a two-dimensional coil structure.

The second heating layer arrangement may be electrically contacted by an electrical via extending from the first side to the second side of the main body.

In particular, this brings about the technical advantage of being able to electrically contact the second heating layer arrangement efficiently. That is to say that the second heating layer arrangement is and/or has been electrically contacted from the first side, i.e., from the upper side of the main body, for example.

The carrier may be and/or have been produced by the method of producing a carrier for an optoelectronic component.

The carrier may be produced by the method of producing a carrier for an optoelectronic component.

Technical functionalities of the method of producing a carrier for an optoelectronic component emerge in analogous fashion from the corresponding technical functionalities of the carrier for an optoelectronic component, and vice versa. That is to say that method features of the method of producing a carrier for an optoelectronic component emerge from corresponding apparatus features of the carrier for an optoelectronic component, and vice versa.

The electrically conductive heating layer arrangement, i.e., the first and/or the second heating layer arrangement in particular, may be and/or have been produced by a vapor deposition process and/or electrolytic process.

That is to say that layers, i.e., layers of the heating layer arrangement, first and/or second solder layer, first and/or second passivation layer, for example, are vapor deposited layers and/or electrolytically applied or electrodeposited layers.

The phrase "and/or" comprises, in particular, alternatively the phrase "and" or the phrase "or."

The main body may be soldered onto a further carrier by the second solder layer.

The technical advantage brought about by vapor deposition processes and electrodeposition processes is that, in particular, the individual layers can be produced efficiently using process methods known per se.

The first and/or second heating layer arrangement may be and/or are integrated in the main body.

The main body may be configured as a submount and/or may be a submount. A submount advantageously serves for efficient handling and/or as an efficient thermal conductor and/or for an efficient thermal spread and/or for an efficient compensation of different thermal expansions. That is to say, in particular, that a submount is configured, in particular, for handling and/or for thermal conduction and/or for a thermal spread and/or for a compensation of different thermal expansions.

That is to say that, in particular, the main body and/or the submount is formed as a thermal conductor, for example. In particular, the main body and/or the submount is formed to compensate different thermal expansions.

The above-described properties, features and advantages and the manner in which they are achieved will become clearer and more easily understandable in conjunction with the following description of the examples, explained in more detail in conjunction with the drawings.

Below, the same reference signs can be used for the same features. Moreover, for purposes of a better overview, not all elements in all drawings always have a reference sign.

FIG. 1 shows a carrier 101 for an optoelectronic component in a front view.

No optoelectronic component has been shown for reasons of clarity.

The carrier 101 comprises a main body 103. The main body 103 is configured as a submount, for example. By way of example, the main body 103 is formed from one or more of the following materials and/or comprises one or more of the following materials: AlN, SiC, Si.

The main body 103 has a first side 105. By way of example, the first side 105 is the upper side of the main body 103.

A first electrically conductive heating layer arrangement 107 is applied or arranged on the first side 105. By way of example, the first heating layer arrangement 107 has been deposited on the first side 105 by an electrodeposition method. By way of example, the first heating layer arrangement 107 has been vapor deposited on the first side 105 by a vapor deposition method.

Moreover, the main body 103 comprises a first passivation layer 113 applied to both an upper side 127 of the first heating layer arrangement 107 and the first side 105 of the main body 103. By way of example, the passivation layer 113 has been deposited on the first side 105 and on the upper side 127 by an electrodeposition method. By way of example, the passivation layer 113 has been vapor deposited.

The first heating layer arrangement 107 has been structured such that it has a heating portion 109 and two electrical contacting portions. Only the first contacting portion is illustrated as FIG. 1 shows a front view of the carrier 101, with the first electrical contacting portion being denoted by curly braces with the reference sign 111.

The first electrical contacting portion 111 consequently contacts the heating portion 109.

Further, an electric line 117 extends from an upper side 115 of the first passivation layer 113 to the first contacting portion 111. Consequently, the first contacting portion 111 can thus be electrically contacted from the upper side 115 of the passivation layer 113 by the electric line 117.

By way of example, the electric line 117 is formed by the first heating layer arrangement 107. That is to say that the first heating layer arrangement 107 is structured such that the latter has the electric line 117. Consequently, the passivation layer 113 can be vapor deposited or deposited after formation of the first heating layer arrangement 107 such that a passivation layer forms automatically, the electric line 117 extending therethrough from the upper side of the passivation layer 113 to the first contacting portion 111 of the first heating layer arrangement 107.

By way of example, the first heating layer arrangement 107 is formed as a layer stack. By way of example, the layer stack comprises the following three layers: a titanium layer, a platinum layer, a gold layer. By way of example, as seen from the main body 103, the titanium layer is arranged first on the first side 105. The platinum layer is arranged on the titanium layer. The gold layer is arranged on the platinum layer.

By way of example, the passivation layer comprises one or more of the following materials and/or is formed from one or more of the following materials:

A further layer arrangement 119 is arranged on the upper side 115 of the first passivation layer 113. By way of example, the further layer arrangement 119 is vapor deposited or deposited. The further layer arrangement 119 comprises a titanium layer, a platinum layer and a gold layer, for example. By way of example, the titanium layer of the further layer arrangement 119 has been arranged as a first layer on the upper side 115 of the first passivation layer 113. By way of example, the platinum layer follows as a second layer and the gold layer, for example, follows as third layer.

A first solder layer 123 is arranged on an upper side 121 of the further layer arrangement 119. The first solder layer 123 has been vapor deposited or deposited, for example. The first solder layer 123 has an upper side 125. An optoelectronic component may be arranged on the upper side 125 of the first solder layer 123 to solder the optoelectronic component onto the main body 103, i.e., onto the first side 105.

By way of example, the solder layer 123 is formed as an AuSn layer.

Thus, the heating portions 109 is arranged between the first 105 side of the main body 103 and the solder layer 123.

Thermal energy must be supplied to the first solder layer 123 to melt the solder layer 123. The first heating layer arrangement 107 is provided to this end. The latter is electrically contacted by way of its two contacting portions such that an electric current flows through the first heating layer arrangement 107. Since the first heating layer arrangement 107 has an ohmic resistance, the first heating layer arrangement 107 acts as an ohmic resistance heater and consequently produces thermal energy.

On account of the employed materials for the individual layers, a thermal connection is first formed between the first heating layer arrangement 107 and the first solder layer 123. Thermal energy can be efficiently supplied to the first solder layer 123 by this thermal connection, the thermal energy having been produced by the first heating layer arrangement 107.

The first heating layer arrangement 107 is electrically insulated from the first solder layer 123 on account of the passivation layer 113. The passivation layer 113 also insulates the first heating layer arrangement 107 from the further layer arrangement 119. In general, the first heating layer arrangement 107 is electrically insulated from further metallizations of the main body 103, in particular.

By way of example, the heating portion 109 has a stripe form or a two-dimensional coil structure.

Figure 2:
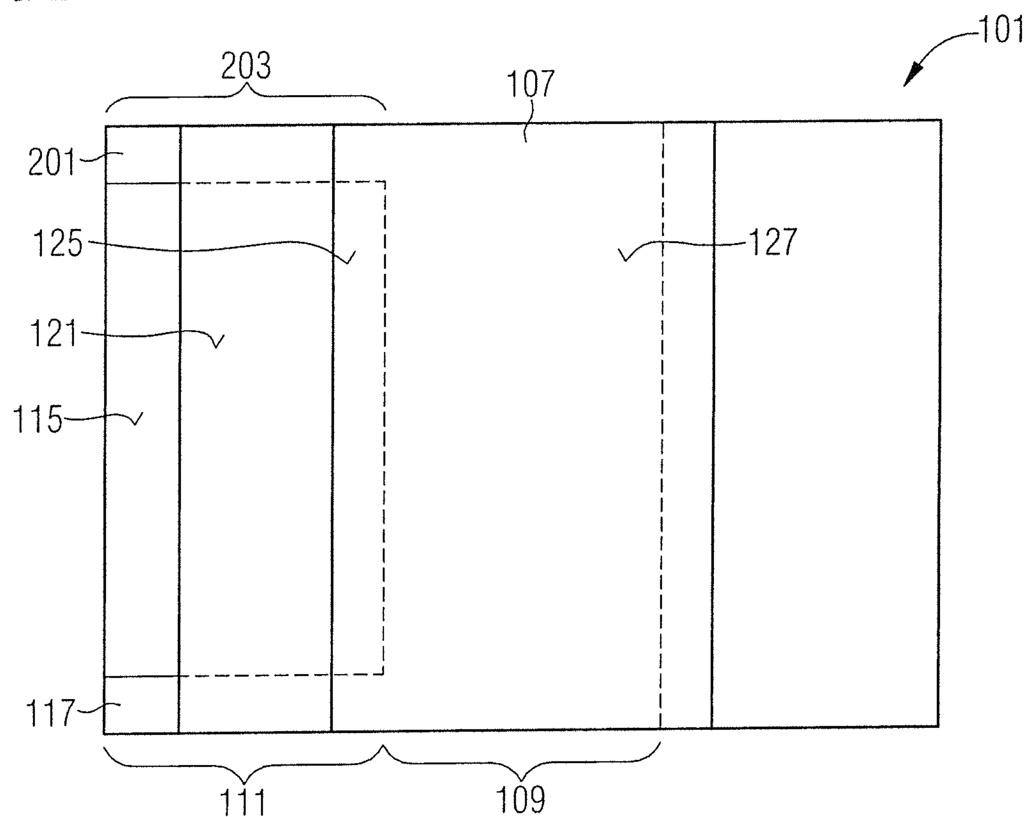
FIG. 2 shows a heating portion having a stripe form.

FIG. 2 shows the carrier 101 according to FIG. 1 in a view from above on the first side 105, wherein the heating portion 109 of the first heating layer arrangement 107 may have a stripe form.

In the view from above, it is now possible to also identify the second electrical contacting portion 203 and an electric line 201, extending in a manner analogous to the electric line 117 from the upper side 115 of the passivation layer 113 to the second electrical contacting portion 203. The explanations given in conjunction with the electric line 117 apply analogously to the electric line 201.

Figure 3:
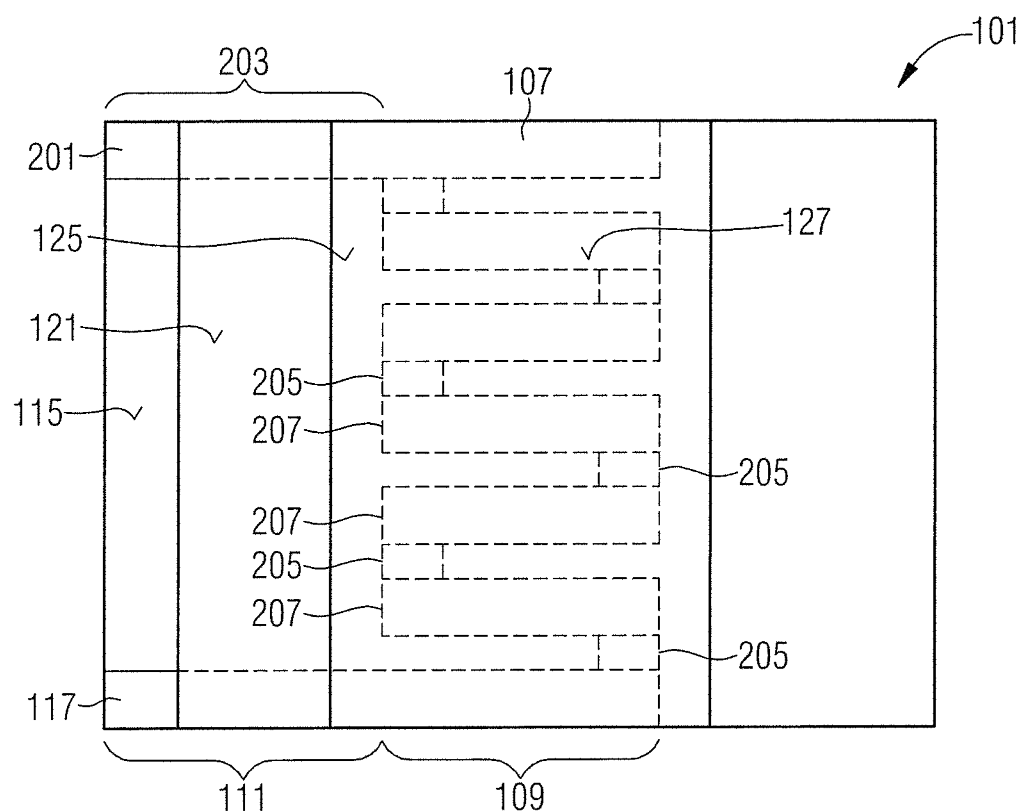
FIG. 3 shows a heating portion having a two-dimensional coil structure.

FIG. 3 shows a view from above on the carrier 101 of FIG. 1, wherein the heating portion 109 has a two-dimensional coil structure according to a further example. The coil structure comprises a plurality of portions 205, 207. The portions 205 are laterally offset from one another in relation to a longitudinal axis of the main body 103, wherein the portions 205 laterally offset from one another are each connected to one another by a connection portion 207.

Figure 4:
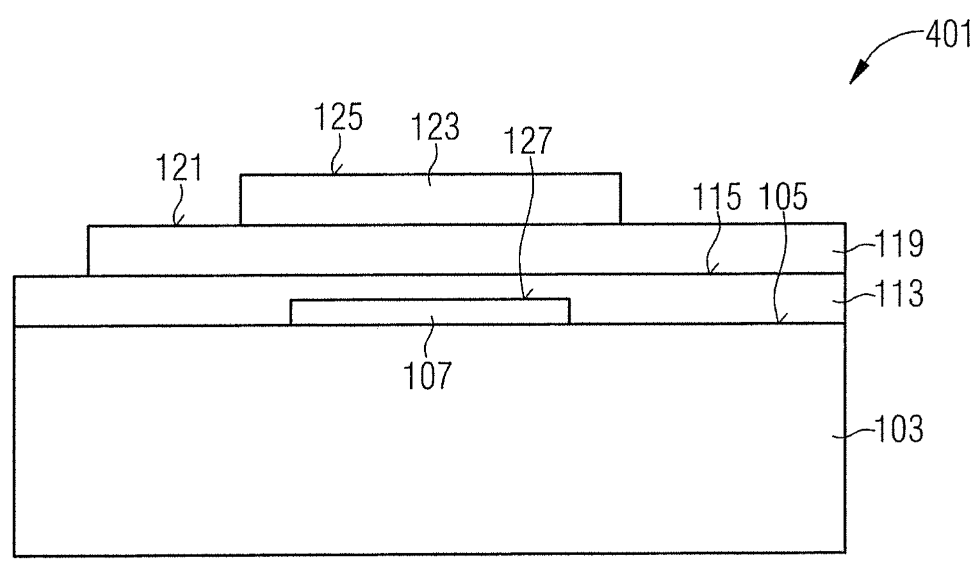
FIGS. 4 and 5 each show a different view of a second carrier for an optoelectronic component prior to melting the solder layer.

FIG. 4 shows a front view of a second carrier 401 for an optoelectronic component.

Figure 5:
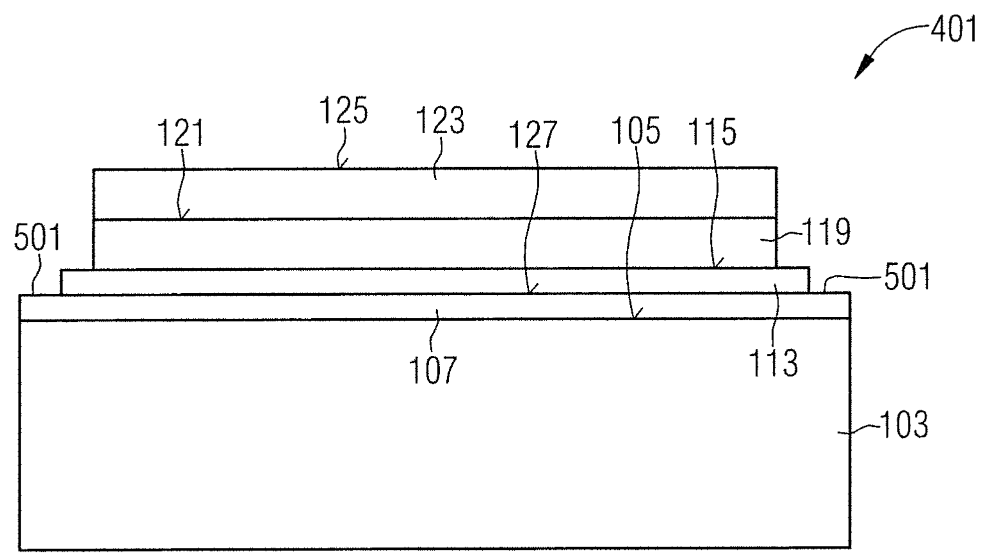

The second carrier 401 is formed in a substantially analogous manner to the first carrier 101. Reference is made to the corresponding explanations. FIG. 5, which shows a side view of the second carrier 401 according to FIG. 4, shows a difference.

The first heating layer arrangement 107 has two opposing exposed portions 501 provided at the edge of the first side 105. That is to say, the passivation layer 113 does not cover the entire area of the first heating layer arrangement 107, but still leaves the second portions 501 exposed. Consequently, an open step structure is created—the exposed portions 501.

When the solder layer 123 melts, molten solder flows on the exposed portions 501 of the first heating layer arrangement 107. Thus, the molten solder establishes an electrical connection to the first heating layer arrangement 107, for example, to the gold layer. This brings about the technical effect of reducing an electrical resistance of the first heating layer arrangement 107, and correspondingly reduces a heat influx into the first heating layer arrangement 107. This advantageously facilitates a self-regulating soldering process.

FIGS. 1 to 6 illustrate carriers only having a first heating layer arrangement on the first side 105. Consequently, the carriers have a one-sided structure. By way of example, these carriers can be referred to as carriers structured on one side.

Figure 7:
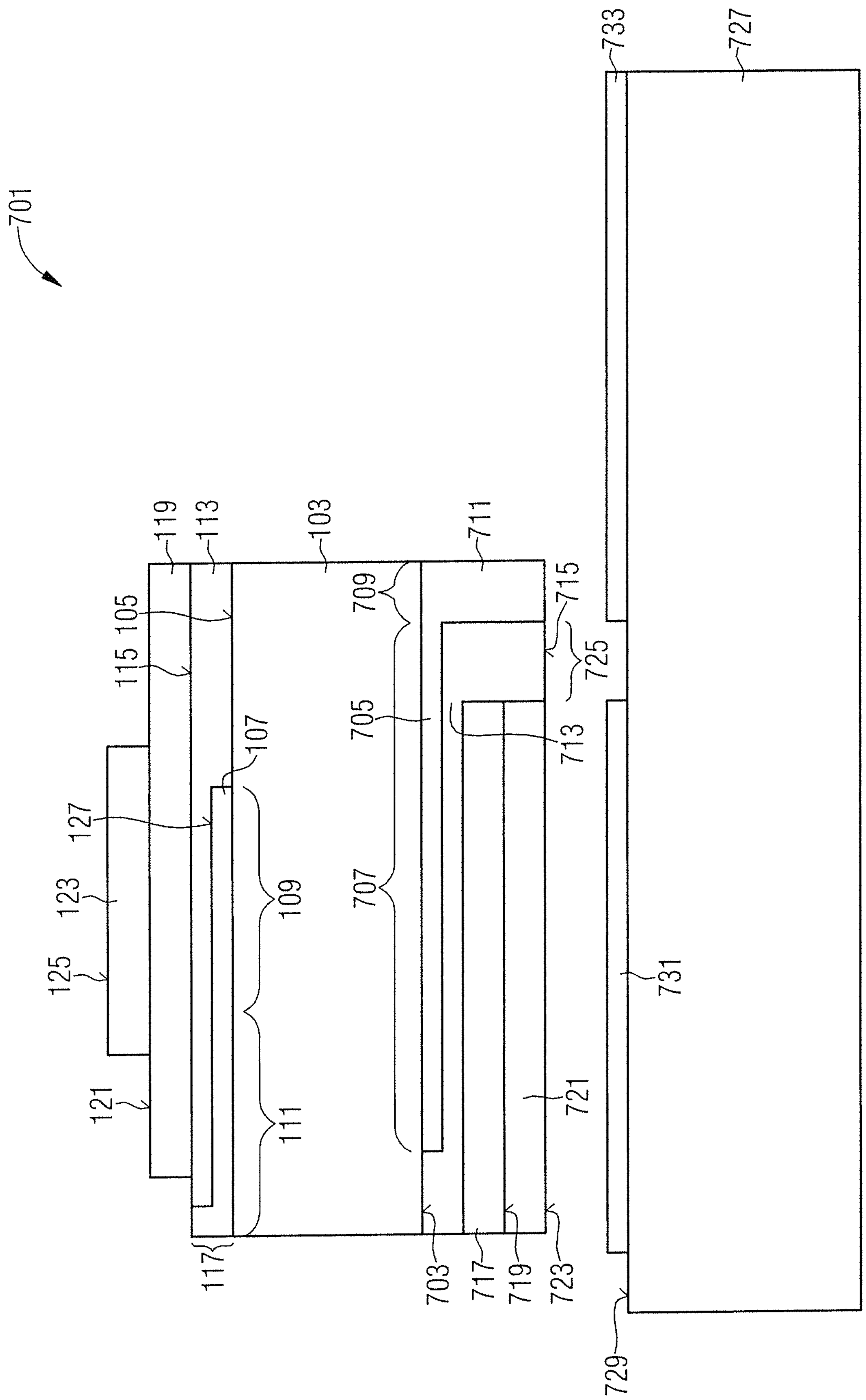
FIG. 7 shows a third carrier for an optoelectronic component.
Figure 8:
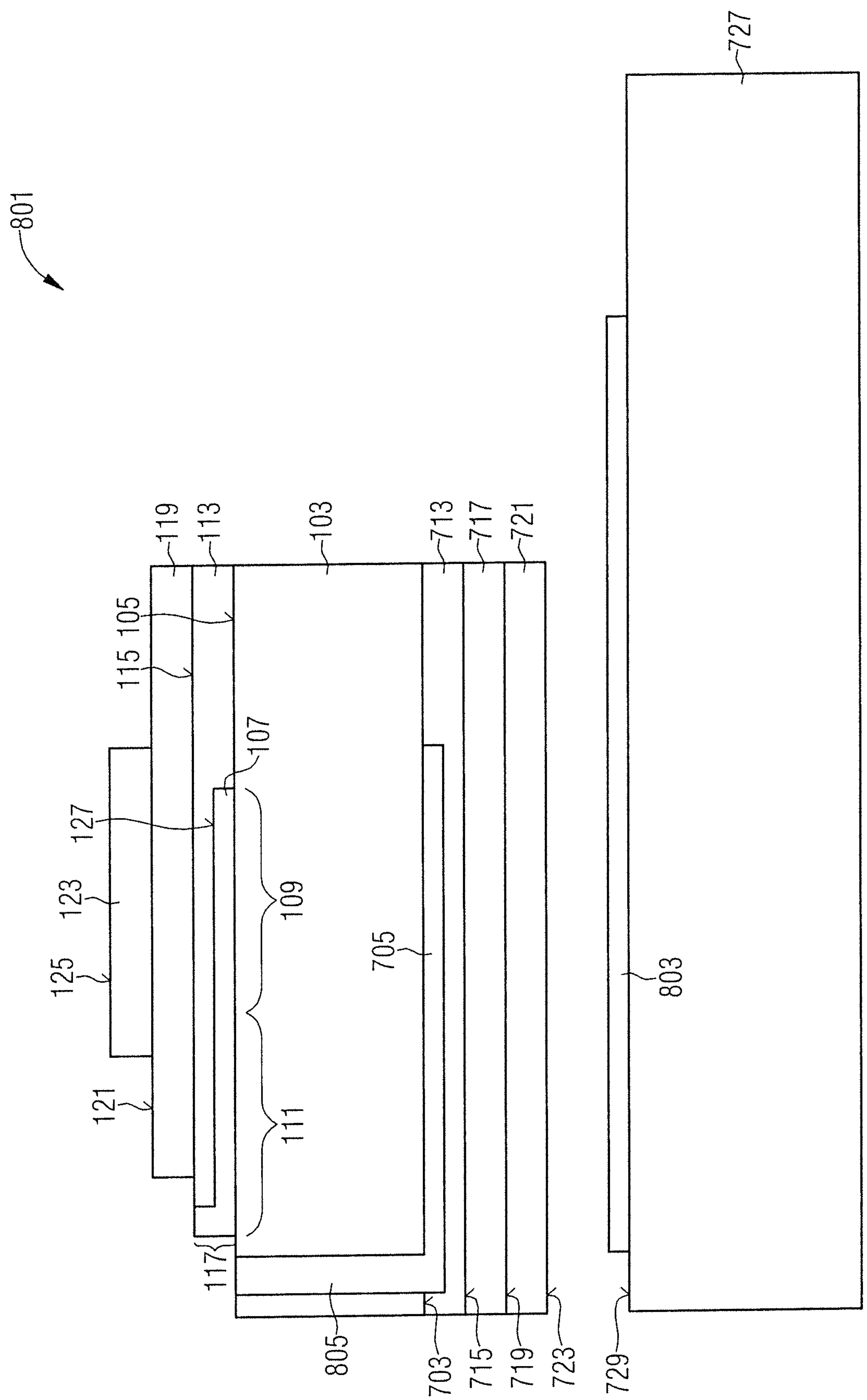
FIG. 8 shows a fourth carrier for an optoelectronic component.

By contrast, FIGS. 7 and 8 show a two-sided structure of the carrier, i.e., carriers structured on two sides in the sense that a second heating layer arrangement is arranged on a second side of the main body in that case, with the second side lying opposite the first side. This will be explained in more detail below.

FIG. 7 shows a third carrier 701 in a front view.

The first side 105 of the main body 103 is structured in a manner analogous to the carrier 101 according to FIG. 1. Reference is made to the explanations made accordingly.

A second side 703 of the main body 103 is likewise structured, with the second side 703 lying opposite the first side 105. In general, structured means that a layer structure has been applied to the corresponding side.

The second side 703 is provided with a second electrically conductive heating layer arrangement 705. Explanations that were given in conjunction with the first heating layer arrangement 107 apply to the second heating layer arrangement 705, in particular in an analogous fashion. Accordingly, the second heating layer arrangement 705 has a heating portion 707 and a first contacting portion 709 and a second contacting portion, which cannot be seen on account of the front view. The second contacting portion is electrically contacted in a manner analogous to the first contacting portion 709 by a line formed in an analogous fashion to the line 711.

The two heating portions 109 and 707 each lie between the first and/or second side of the main body 103 and the corresponding solder layer.

Accordingly, an electric line 711 extends from an upper side 715 of a second passivation layer 713 to the first contacting portion 709 of the second heating layer arrangement 705.

In a manner analogous to the first side 105, the second side 703 provides a second further layer arrangement 717 and a second solder layer 721. The second further layer arrangement 717 is at least partly applied to the second passivation layer 713. The second solder layer 721 is arranged on second this further layer arrangement 717, namely on an upper side 719 of the further layer arrangement 717.

Explanations given in conjunction with the first solder layer 123 and/or with the further layer arrangement 119 apply analogously to the further layer arrangement 717 and to the second solder layer 721. In particular, the second further layer arrangement 717 also can be referred to as further layer arrangement for reasons of simplicity.

The second passivation layer 713 has a portion denoted by curly braces with the reference sign 725, the portion electrically insulating the further layer arrangement 717 and the second solder layer 721 from the electric line 711. The upper side 715 of the portion 725 of the second passivation layer 713 and an upper side 723 of the second solder layer 721 and an upper side of the electric line 711 extend flush with one another.

A carrier component 727 has an assembly area 729. Two electrical contacting areas 731, 733 are arranged on the assembly area 729 at a distance from one another and electrically insulated from one another. The distance between the two contacting areas 731 and 733 substantially corresponds to a width of the portion 725, i.e., a distance between the second solder layer 721 and the electric line 711. A third electrical contacting area is arranged on the assembly area 729. However, it is not visible on account of the front view. The third electrical contacting area is arranged at a distance from and electrically insulated in relation to the two electrical contacting areas 731, 733 on the assembly area 729.

The carrier 701, more precisely the main body 703, is arranged on the assembly area 729 with the second side 703, which is formed as the lower side of the main body 103, for example. This is performed such that the electrical contacting area 731 contacts the second solder layer 721. The electrical contacting area 733 contacts the electric line 711. The third electrical contacting area, not visible here, contacts the second contacting portion (likewise not visible) of the second heating layer arrangement 705.

Consequently, a power supply to the second solder layer 721 is facilitated via the electrical contacting areas 731. Consequently, a power supply to the line 711 and to the line, which contacts the second contacting portion, is facilitated via the electrical contacting area 733 and via the third electrical contacting area.

The second heating layer arrangement 705 produces thermal energy in a manner analogous to the first heating layer arrangement 107 to supply the thermal energy to the second solder layer 721 to melt the latter.

FIG. 8 shows a fourth carrier 801 in a front view.

A two-sided structure is also provided in the fourth carrier 801 for an optoelectronic component. That is to say that a layer structure has also been provided on the second side 703 of the main body 103.

According to the example shown in FIG. 8, the passivation layer 713 completely covers the second heating layer arrangement 705. The further layer arrangement 717 is applied to the upper side 715 of the second passivation layer 713, with the second solder layer 721 in that case being applied to the upper side 719 of the further layer arrangement 717.

Electrical contacting of the second heating layer arrangement 705 is formed by way of two vias, with only one of the two vias being visible on account of the front view. This one electrical via is provided with reference sign 805.

The electrical via 805 extends through the main body 103 from the first side 105 to the second side 703 of the main body 103. That is to say that the second heating layer arrangement 705 is contacted from the first side 105 of the main body 103.

Consequently, the electrical contacting areas of the assembly area 729 of the carrier component 727 for electrical contacting of the corresponding contacting portions of the second heating layer arrangement 705, as seen from the second side 703 of the main body 103 and as were still provided in the example according to FIG. 7, are dispensed with.

Consequently, the assembly area 729 of the carrier component 727 is only provided with a single electrical contacting area 803.

Consequently, the two-sided structured carriers 701, 801 according to FIGS. 7 and/or 8 advantageously render it possible both to solder an optoelectronic component onto the first solder layer 123 and to solder the main body 103 itself, with its second side 703, onto a further component, in this case the carrier component 727. Consequently, the carrier component 727 carries the corresponding carrier 701, 801.

Figure 9:
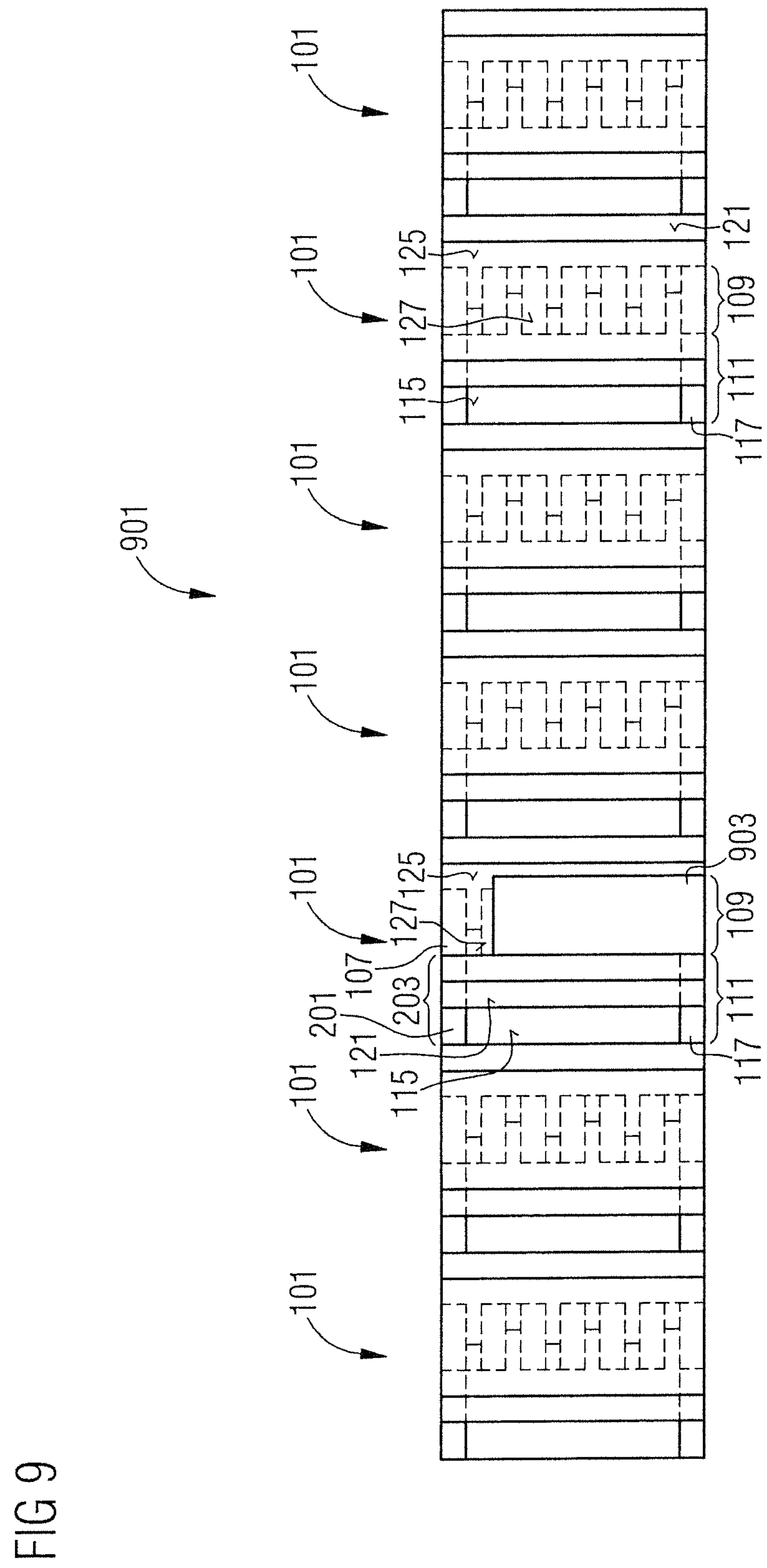
FIG. 9 shows a wafer comprising a plurality of carriers for an optoelectronic component.

FIG. 9 shows a view from above on a wafer 901. The wafer 901 comprises a plurality of carriers 101 configured according to the carrier 101 of the FIG. 3.

One of the carriers 101 is provided with an optoelectronic component 903. That is to say that the optoelectronic component 903 is arranged on the upper side 125 of the first solder layer 123. If a voltage is applied to the corresponding electrical contacting portions 111, 203 of the first heating layer arrangement 107, only the first solder layer 123 is heated. Thus, local heating takes place. The adjacent carriers 101 are not heated or at least they are only heated to below a melting temperature of the corresponding solder layer thereof. That is to say that the adjacent carriers 101 remain below the solder temperature when the carrier 101 with the optoelectronic component 903 is heated.

Figure 6:
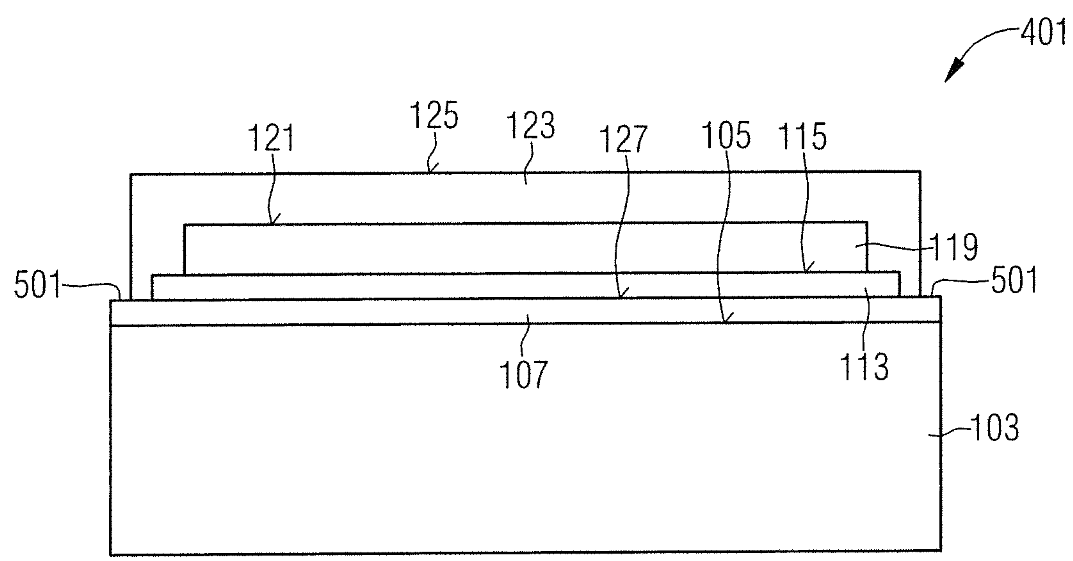
FIG. 6 shows the carrier according to FIGS. 4 and 5 after melting the solder layer.
Figure 10:
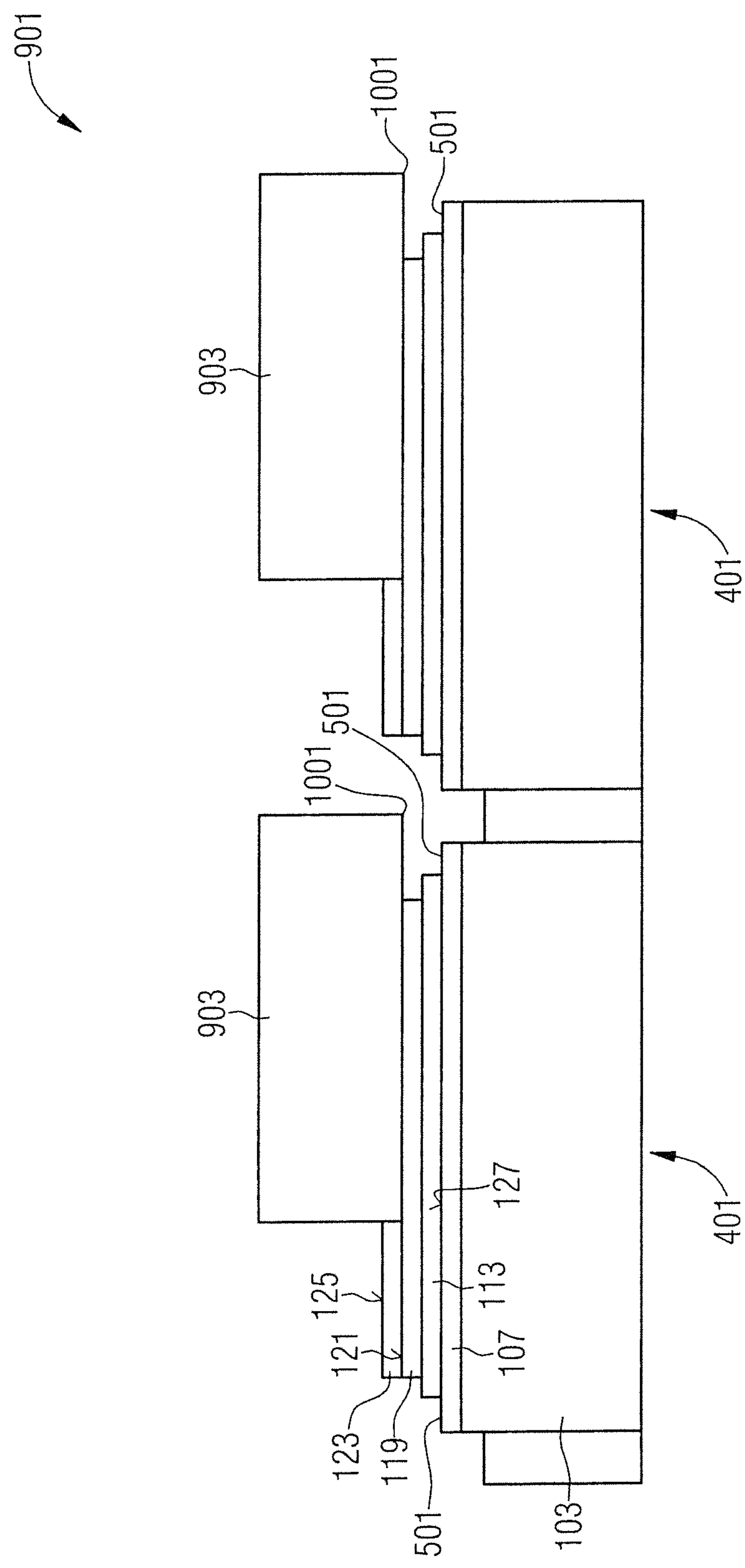
FIG. 10 shows a wafer comprising a plurality of other carriers for an optoelectronic component.

FIG. 10 shows a wafer comprising a plurality of carriers 401 according to the examples of FIGS. 4 to 6 in a side view, with, here too, an optoelectronic component 903 being respectively arranged on the upper side 125 of the corresponding first solder layer 123.

The illustration according to FIG. 10 shows the wafer 901 prior to soldering, thus prior to melting the first soldering layer 123.

The optoelectronic component 903 projects beyond the respective first side 105 of the main body 103, and so an edge 1001 of the component 903 projects beyond the main body 103. What is advantageously brought about thereby is that, for example, in a light emission of the component 903, the light usually emitted in the region of the edge 1001, in particular, is not shadowed by the structured main body 103.

Figure 11:
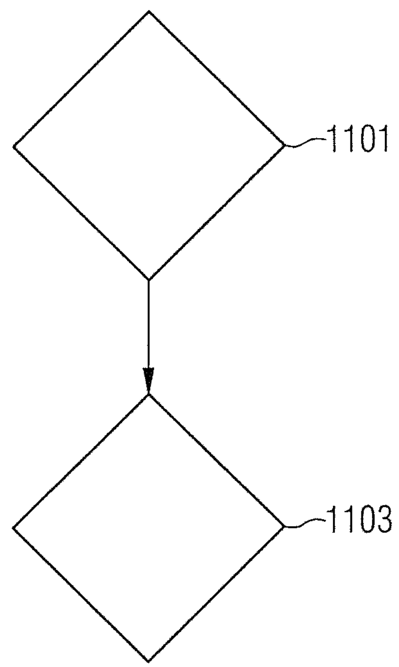
FIG. 11 shows a flowchart of a method of producing a carrier for an optoelectronic component.

FIG. 11 shows a flowchart of a method of producing a carrier for an optoelectronic component.

The method comprises the following steps:

providing 1101 a main body, wherein the main body comprises a first electrically conductive heating layer arrangement, forming 1103 an electrical insulation, a thermal connection and a first solder layer for soldering an optoelectronic component to the main body on a first side of the main body such that the first electrically conductive heating layer arrangement is electrically insulated from the first solder layer and thermally connected to the first solder layer.

One or more of the layers, as described above, may be and/or have been electrodeposited and/or vapor deposited.

Figure 12:
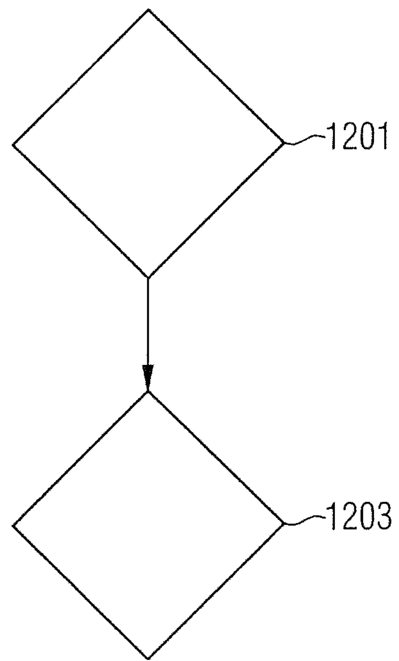
FIG. 12 shows a flowchart of a soldering method.

FIG. 12 shows a flowchart of a soldering method using a carrier or a wafer as described above or below to solder an optoelectronic component to the main body by the first solder layer.

According to step 1201, the first electrically conductive heating layer arrangement has a voltage or an electric current applied thereto such that the first electrically conductive heating layer arrangement heats up to melt the first solder layer. When the melt temperature of the first solder layer is reached, the first solder layer melts such that the optoelectronic component is soldered by the molten solder layer to the main body according to step 1203.

In summary, an efficient technical concept is provided such that a main body of a carrier has an electrically conductive structure which, for example, is formed on a first and/or second side of the main body and/or in the main body itself. This electrically conductive structure is referred to here as the first and/or second heating layer arrangement. This electrically conductive structure is electrically insulated from the solder layer, but thermally connected to the latter. The electrically conductive structure acts as an electrical resistance heater and produces the thermal energy necessary for soldering. Consequently, a carrier for an optoelectronic component is thus produced, the carrier having a dedicated heater to melt the solder layer or the solder layers.

Even though our carriers, wafers and methods have been described and illustrated in detail more closely by preferred examples, this disclosure is not restricted by the disclosed examples and other variations can be derived therefrom by those skilled in the art without departing from the scope of protection of the appended claims.

This application claims priorities of DE 10 2015 121 711.2 and 10 2016 106 734.2, the subject matter of which is incorporated herein by reference.

The invention claimed is:

1. A carrier for an optoelectronic component comprising:
- a main body,
- wherein the main body comprises a first electrically conductive heating layer arrangement,
- a first solder layer for soldering an optoelectronic component to the main body is arranged on a first side of the main body,
- the first electrically conductive heating layer arrangement is electrically insulated from the first solder layer and thermally connected to the first solder layer,
- the first heating layer arrangement has an exposed portion on which molten solder of the first solder layer can flow to reduce an electrical resistance of the first heating layer arrangement,
- the first heating layer arrangement has a first electrical contacting portion, a second electrical contacting portion and a heating portion extending between the first solder layer and the first side, and the heating portion of the first heating layer arrangement is electrically contacted by the two electrical contacting portions of the first heating layer arrangement, and
- the heating portion of the first heating layer arrangement has a two-dimensional coil structure.

2. The carrier according to claim 1, wherein the first heating layer arrangement is electrically insulated from the first solder layer by a first electrically insulated passivation layer by virtue of the first passivation layer being arranged at least in part on the first heating layer arrangement, and the first solder layer is arranged at least indirectly on the first passivation layer.

3. The carrier according to claim 2, wherein an electric line is formed to electrically contact the first heating layer arrangement, and the electric line extends from an upper side facing away from the first side of the main body of the first passivation layer to the first heating layer arrangement through the first passivation layer.

4. The carrier according to claim 3, wherein the electric line is formed by the first heating layer arrangement.

5. The carrier according to claim 1, wherein the thickness of the first electrically conductive heating layer arrangement is 15 nm to 200 nm.

6. The carrier according to claim 1, further comprising an optoelectronic component, wherein the optoelectronic component is soldered onto the main body or soldered with the main body by the first solder layer.

7. The carrier according to claim 1, wherein the first side of the main body is an upper side of the main body.

8. The carrier according to claim 1, wherein the main body is configured as a submount.

9. The carrier according to claim 1, wherein a second electrically conductive heating layer arrangement is arranged on a second side of the main body, lying opposite the first side, and the second heating arrangement is electrically insulated from a second solder layer arranged on the second side and thermally connected to the second solder layer.

10. The carrier according to claim 9, wherein the main body is soldered onto a further carrier by the second solder layer.

11. The carrier according to claim 9, wherein the second heating layer arrangement is electrically contacted by an electrical via extending from the first side to the second side of the main body.

12. A wafer comprising a plurality of carriers according to claim 1.

13. A soldering method using a wafer according to claim 12, wherein an optoelectronic component is soldered to the main body by the first solder layer by virtue of the first electrically conductive heating layer arrangement having a voltage or an electric current applied thereto such that the first electrically conductive heating layer arrangement is heated to melt the first solder layer.

14. A soldering method using a carrier according to claim 1, wherein an optoelectronic component is soldered to the main body by the first solder layer by virtue of the first electrically conductive heating layer arrangement having a voltage or an electric current applied thereto such that the first electrically conductive heating layer arrangement is heated to melt the first solder layer.

15. The soldering method according to claim 14, wherein molten solder of the first solder layer flows onto an exposed portion of the first heating layer arrangement to reduce an electrical resistance of the first heating layer arrangement.

16. A method of producing a carrier for an optoelectronic component comprising:
- providing a main body, wherein the main body comprises a first electrically conductive heating layer arrangement, and
- forming an electrical insulation, a thermal connection and a first solder layer for soldering an optoelectronic component to the main body on a first side of the main body such that the first electrically conductive heating layer arrangement is electrically insulated from the first solder layer and thermally connected to the first solder layer,
- such that the first heating layer arrangement has a first electrical contacting portion, a second electrical contacting portion and a heating portion extending between the first solder layer and the first side, and the heating portion of the first heating layer arrangement is electrically contacted by the two electrical contacting portions of the first heating layer arrangement, and
- such that the heating portion of the first heating layer arrangement has a two-dimensional coil structure.

17. A carrier for an optoelectronic component comprising:

a main body, wherein the main body comprises a first electrically conductive heating layer arrangement, a first solder layer for soldering an optoelectronic component to the main body is arranged on a first side of the main body, the first electrically conductive heating layer arrangement is electrically insulated from the first solder layer and thermally connected to the first solder layer, the first heating layer arrangement has an exposed portion on which molten solder of the first solder layer can flow to reduce an electrical resistance of the first heating layer arrangement, a second electrically conductive heating layer arrangement is arranged on a second side of the main body, lying opposite the first side, and the second heating arrangement is electrically insulated from a second solder layer arranged on the second side and thermally connected to the second solder layer, wherein the second heating layer arrangement is electrically contacted by an electrical via extending from the first side to the second side of the main body.

18. A carrier for an optoelectronic component comprising:

a main body comprising a first electrically conductive heating layer arrangement, and a first solder layer for soldering an optoelectronic component to the main body is arranged on a first side of the main body, wherein the first electrically conductive heating layer arrangement is electrically insulated from the first solder layer and thermally connected to the first solder layer, the first heating layer arrangement has an exposed portion on which molten solder of the first solder layer can flow to reduce an electrical resistance of the first heating layer arrangement, the first electrical heating layer arrangement is structured such that it has a heating portion and two electrical contacting portions and comprises a layer stack formed from a titanium layer, a platinum layer and a gold layer, and the titanium layer is arranged on the first side of the main body as a first layer of the layer stack, the platinum layer is arranged on the titanium layer as a second layer of the layer stack, and the gold layer is arranged on the platinum layer as a third layer of the layer stack.

19. The carrier according to claim 18, wherein a thickness of the first electrically conductive heating layer arrangement is 15 nm to 200 nm.

20. The carrier according to claim 18, wherein the heating portion comprises the layer stack formed from the titanium layer, the platinum layer and the gold layer.

* * * * *